United States Patent
Ni et al.

(10) Patent No.: US 10,879,063 B2
(45) Date of Patent: Dec. 29, 2020

(54) METHOD FOR FABRICATING HIGH-QUALITY AND HIGH-UNIFORMITY III-NITRIDE EPI STRUCTURE

(71) Applicant: Suzhou Han Hua Semiconductor Co.,Ltd, Suzhou (CN)

(72) Inventors: Xianfeng Ni, Suzhou (CN); Qian Fan, Suzhou (CN); Wei He, Suzhou (CN)

(73) Assignee: SUZHOU HAN HUA SEMICONDUCTOR CO., LTD., Jiangsu (CN)

( * ) Notice: Subject to any disclaimer, the term of this patent is extended or adjusted under 35 U.S.C. 154(b) by 72 days.

(21) Appl. No.: 16/438,479

(22) Filed: Jun. 12, 2019

(65) Prior Publication Data
US 2019/0304772 A1  Oct. 3, 2019

(30) Foreign Application Priority Data
May 28, 2019 (CN) .......................... 2019 1 0421365

(51) Int. Cl.
*H01L 21/02* (2006.01)
*H01L 29/20* (2006.01)
(Continued)

(52) U.S. Cl.
CPC ...... *H01L 21/0254* (2013.01); *H01L 21/0262* (2013.01); *H01L 21/02378* (2013.01); *H01L 29/2003* (2013.01); *H01L 29/205* (2013.01); *H01L 29/66462* (2013.01); *H01L 29/7786* (2013.01)

(58) Field of Classification Search
None
See application file for complete search history.

(56) References Cited

U.S. PATENT DOCUMENTS 8,709,843 B2 * 4/2014 Shakuda ............... H01L 33/007
438/29
8,940,624 B2 * 1/2015 Kawanishi ........ H01L 21/02579
438/479

(Continued)

FOREIGN PATENT DOCUMENTS

CN 103695999 A 4/2014

OTHER PUBLICATIONS

Office Action dated Nov. 8, 2019, issued in counterpart CN application No. 201910421365.4, with English translation. (13 pages).

(Continued)

*Primary Examiner* — Andres Munoz
(74) *Attorney, Agent, or Firm* — Westerman, Hattori, Daniels & Adrian, LLP (57) ABSTRACT

A method of fabricating a high-crystalline-quality and high-uniformity AlN layer within a high electron mobility transistor (HEMT) device with a metalorganic chemical vapor deposition (MOCVD) technique, includes: raising a temperature of a substrate to an ultra-high growth temperature; and supplying an Al source and an N source in pulses over the substrate under the ultra-high growth temperature, wherein the ultra-high growth temperature is at least 1300° C. At least for a first predetermined period of time in each cycle of the pulses, the Al source is switched on when the N source is switched off.

17 Claims, 6 Drawing Sheets

(51) Int. Cl.
*H01L 29/66* (2006.01)
*H01L 29/778* (2006.01)
*H01L 29/205* (2006.01)

(56) References Cited

U.S. PATENT DOCUMENTS

| | | | | |
|---|---|---|---|---|
| 10,439,098 | B2* | 10/2019 | Okuno | H01L 21/02502 |
| 10,490,400 | B2* | 11/2019 | Harada | C23C 16/45527 |
| 2004/0211967 | A1* | 10/2004 | Hirayama | H01L 21/02507 |
| | | | | 257/79 |
| 2004/0224484 | A1* | 11/2004 | Fareed | H01L 21/0242 |
| | | | | 438/478 |
| 2009/0057646 | A1* | 3/2009 | Hirayama | H01L 21/0262 |
| | | | | 257/13 |
| 2011/0073995 | A1* | 3/2011 | Nomura | H01L 33/007 |
| | | | | 257/615 |
| 2015/0235835 | A1* | 8/2015 | Swaminathan | H01L 21/3141 |
| | | | | 438/778 |

OTHER PUBLICATIONS

Office Action dated Feb. 14, 2020, issued in counterpart CN application No. 201910421365.4, with English translation. (11 pages).

* cited by examiner

METHOD FOR FABRICATING HIGH-QUALITY AND HIGH-UNIFORMITY III-NITRIDE EPI STRUCTURE

TECHNICAL FIELD

The present disclosure relates generally to Group III-nitride (GaN, AlN, InN, ScN, BN and/or their alloys) semiconductor epi materials, devices and methods, and more particularly to a method of fabricating III-Nitride on high thermal conductivity substrate epi materials and high electron mobility transistors (HEMTs).

BACKGROUND

Due to their unique material properties, nitride materials like GaN, InN, and AlN, as well as the alloy materials such as AlGaN, InAlN, InGaN, etc., especially AlGaN and InAlN are particularly suitable for HEMT devices capable of delivering high frequency and high power. The nitride based HEMT has found its applications in areas of mobile, satellite, radar communications, and proven its advantages over other semiconductor materials such as Si or GaAs.

The fabrication of GaN HEMT starts with epitaxy of nitride materials on substrates (typically SiC, Si, Sapphire, or GaN, etc) with metalorganic chemical vapor deposition (MOCVD) or molecular beam epitaxy (MBE). The typical epitaxy structure of nitride HEMT comprises of a nucleation layer (typically AlN or low-temperature GaN), a highly-resistive resistive GaN buffer layer and barrier layer (such as AlGaN or AlInN). The epi wafer is tested for essential material properties. Once the epi wafer is characterized, it goes through wafer fab process to form HEMT devices. Typically, ohmic contact metals (Ti/Al/Ni/Au) are deposited on wafers and annealed to form ohmic contact with nitride materials. Then a gate area is defined by typical photolithography process, and gate metal is subsequently deposited to the gate area to form gate contact. More advanced HEMT technologies have different variations from the above-mentioned process. For example, technologies such as in-situ SiNx passivation, multiple 2DEG channels, different barrier materials, device isolation by dry etching, device passivation, field plate may be used for further improvement of device.

Figure 1:
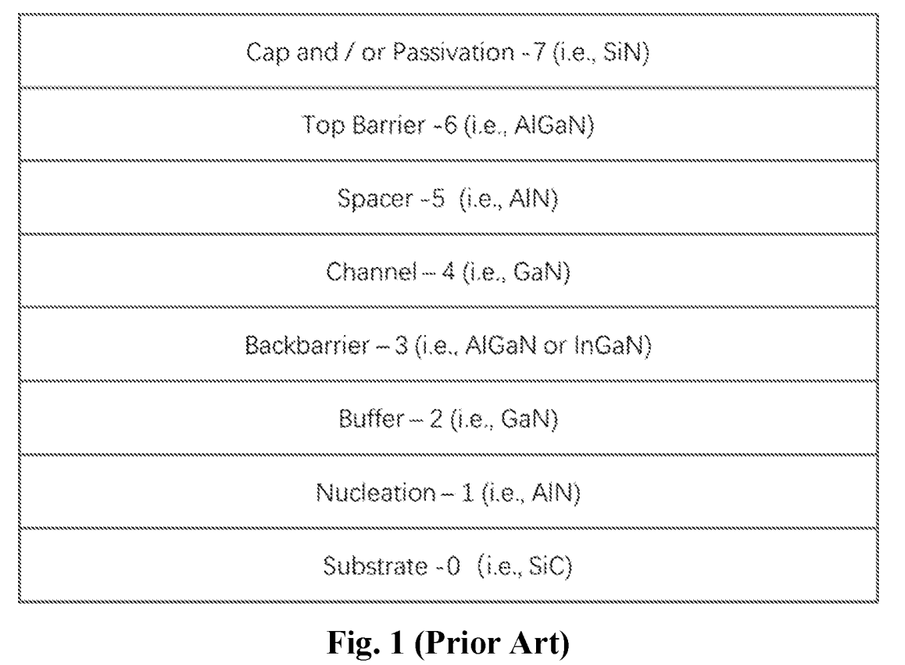
FIG. 1 shows an embodiment of a III-Nitride based HEMT Epi profile.

In the III-nitride HEMT epi structures, there are several layers which may contain or be formed with high Al composition or pure AlN layers. FIG. 1 shows a typical III-Nitride based HEMT Epi profile that contains the substrate layer 0, nucleation layer 1, buffer layer 2, backbarrier layer 3, channel layer 4, spacer layer 5, barrier layer 6, cap and/or passivation layer 7. Among these layers, the nucleation layer 1 and spacer layer 5 are typically formed of pure AlN, and the top barrier layer 6 is typically AlGaN with an Al composition of 20% or higher, and in some cases the top barrier layer can be a pure AlN layer. In some advanced structures, the buffer layer 2, backbarrier layer 3, and channel layer 4 could be formed by AlGaN with an Al composition from 0.1% to 30% or even higher. Cap and/or passivation layer 7 could be formed of SiN and substrate layer 0 could be formed of SiC.

Figure 2A:
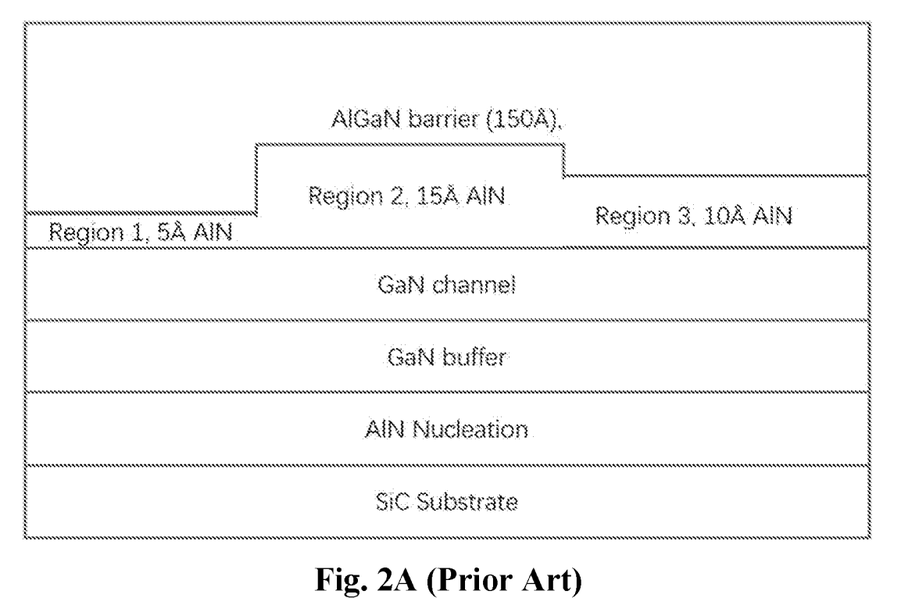
FIG. 2A shows a schematic of an embodiment of an AlGaN/GaN HEMT structure with non-uniform AlN spacer thickness.
Figure 2B:
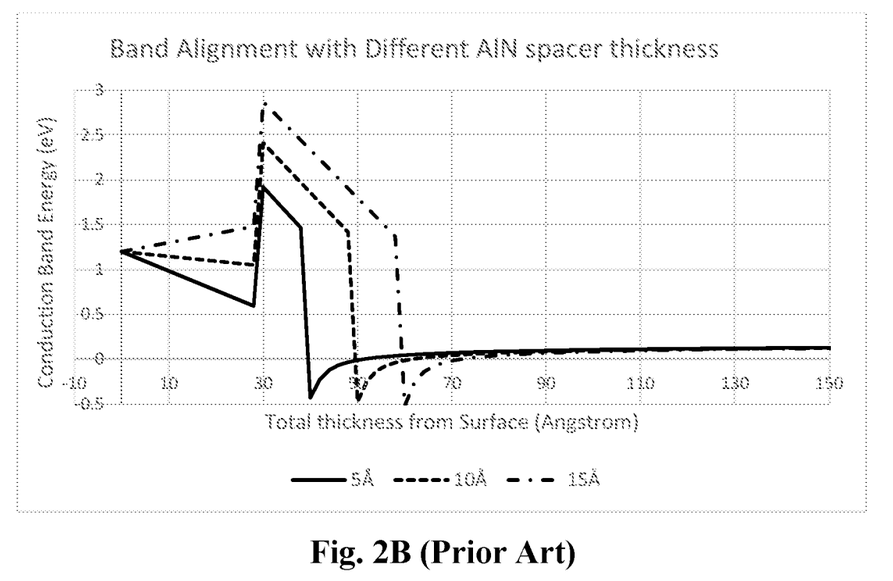
FIG. 2B shows a simulated (using Bandeng with Schroedinger correction) conduction band diagram of the embodiment at different AlN thickness regions.
Figure 2C:
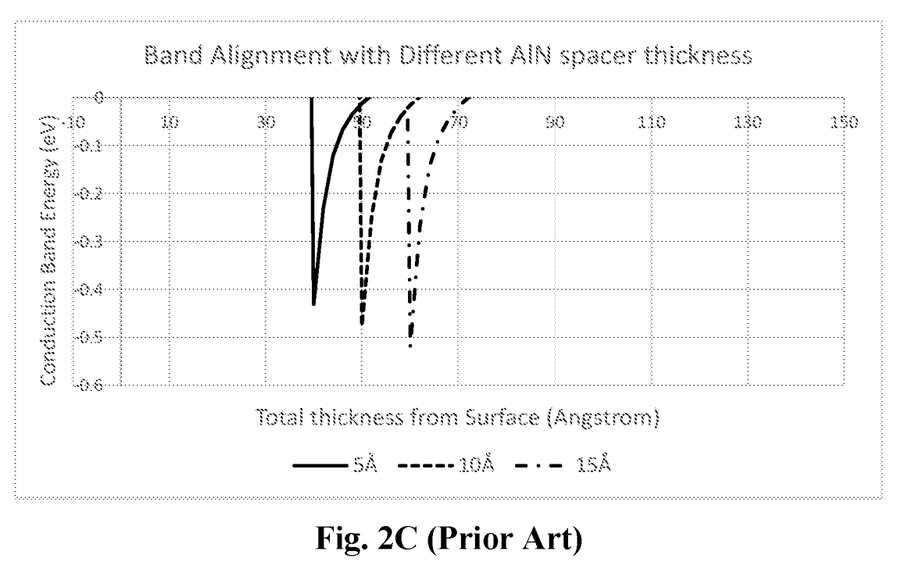
FIG. 2C shows a zoomed out version of FIG. 2B clearly showing that conduction band energy shifts to more negative value with increased AlN thickness.
Figure 2D:
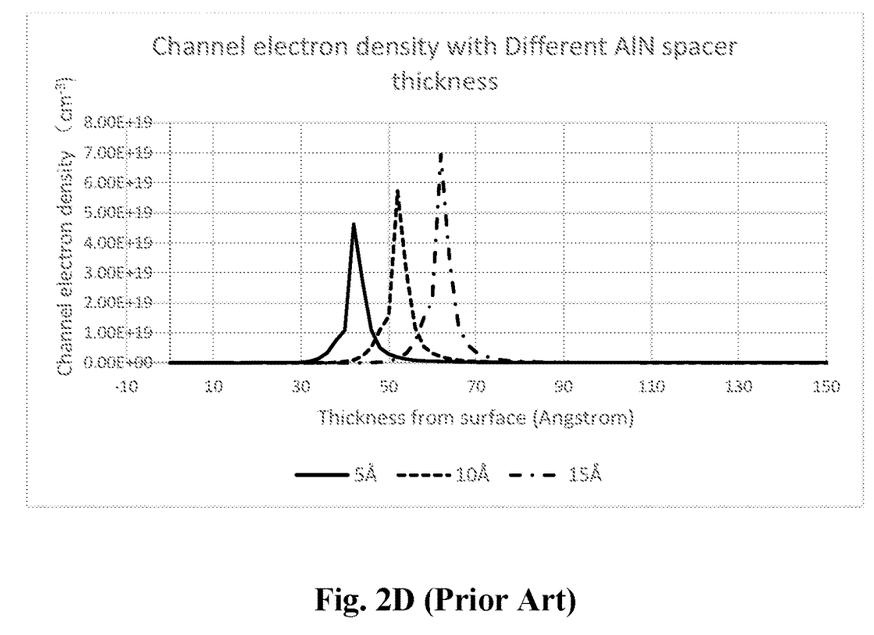
FIG. 2D shows a simulation of the channel electron density of the embodiment with non-uniform AlN spacer thickness, showing that the region with thicker AlN spacer leads to more polarized charge.

Pure AlN spacer layer 5 is typically employed in the III-Nitride epi profile to reduce the alloy scattering while providing a better carrier confinement, resulting better carrier mobility and therefore better device performance such as higher $g_m$ and higher power/frequency operation. Currently, the AlN layer is typically manufactured by either metalorganic chemical vapor deposition (MOCVD) or molecular beam epitaxy (MBE) at a growth temperature of 1180° C. or below. The relatively low growth temperature (<1200° C.) inevitably results in a rough AlN surface and thus non-uniformity in AlN thickness i.e. a portion of AlN layer is thicker than desired thickness while another portion of the AlN layer is thinner than the desired thickness. Such non-uniformity in AlN spacer thickness results in many device reliability issues which prevail in the current art epi and devices. On one hand, the amount of tensile strain produced by the AlN spacer is directly proportional to the thickness of the grown AlN layer, where the region with the thicker AlN has a significantly higher strain. On the other hand, due to the large band gap offset between AlN (6.2 eV) and GaN (3.4 eV), non-uniform AlN thickness also causes large fluctuation in strain induced polarization charge as well as conduction band alignment, which ultimately leads to the non-uniformity in the 2DEG concentration: the region where the AlN layer is thicker, the film has more tensile strain as well as higher 2DEG concentration. FIG. 2A shows a schematic of a typical AlGaN/GaN HEMT structure with non-uniform AlN spacer layer thickness, and FIG. 2B shows a simulated (using Bandeng with Schroedinger correction) conduction band diagram of such an HEMT at different AlN thickness regions. FIG. 2C shows a zoomed out version of FIG. 2B clearly showing that conduction band energy shifts to more negative value with increased AlN thickness, through which region the electrons have more tendency to travel. Moreover, FIG. 2D shows a simulation of the channel electron density with non-uniform AlN spacer thickness, showing that the region with thicker AlN spacer leads to more polarized charge. With a combination of higher electron density and lower conduction band energy, the HEMT region with a higher AlN spacer thickness will be subjected to a significantly more load during the operation as more current passes through. This problem gets even worse considering the same region with the thicker AlN also has significantly higher strain. Dominated by both higher mechanical strain and higher power load during the operation, the current art devices with AlN spacer widely suffer from reliability issues, as the non-uniformity of AlN spacer serves as the fundamental issue. In another words, the region with the thicker AlN serves as the "weakest link" in the material and device structures.

Figure 3A:
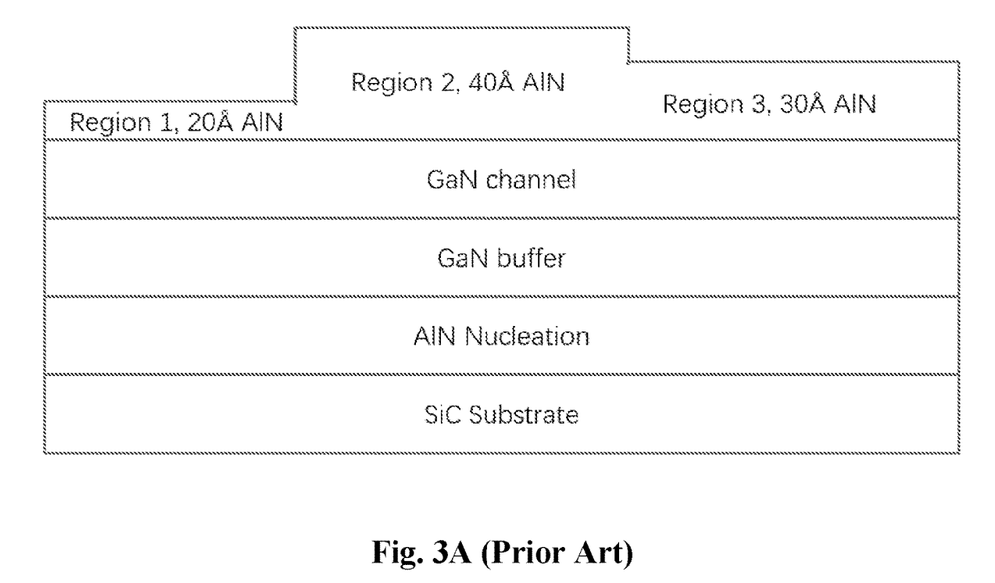
FIG. 3A shows another embodiment of an AlGaN/GaN HEMT structure, with a target barrier thickness of 30 Å and a fluctuation of thickness from 15 Å to 45 Å.
Figure 3B:
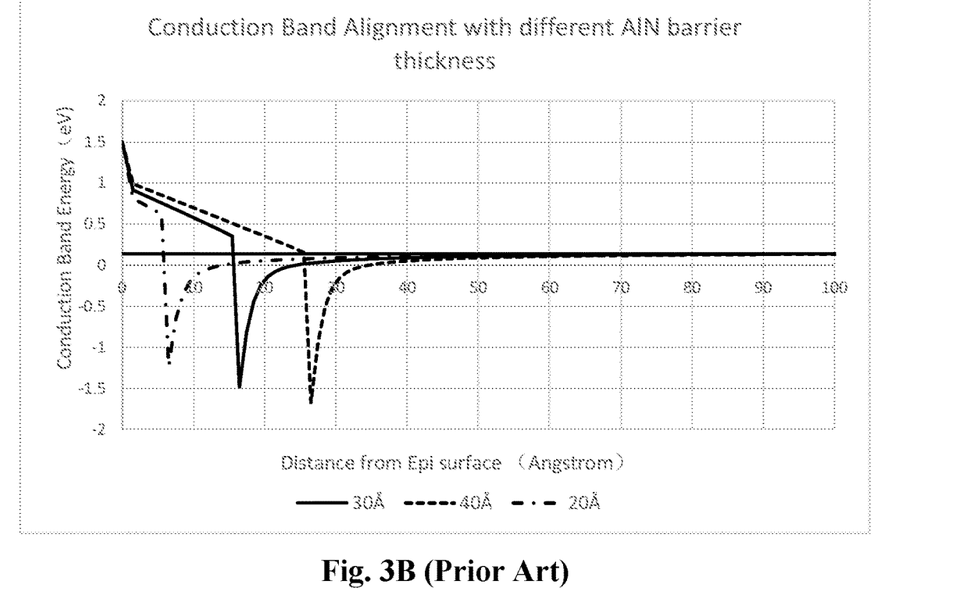
FIG. 3B shows a simulated (using Bandeng with Schroedinger correction) conduction band diagram of the another embodiment at regions with different AlN thicknesses.
Figure 3C:
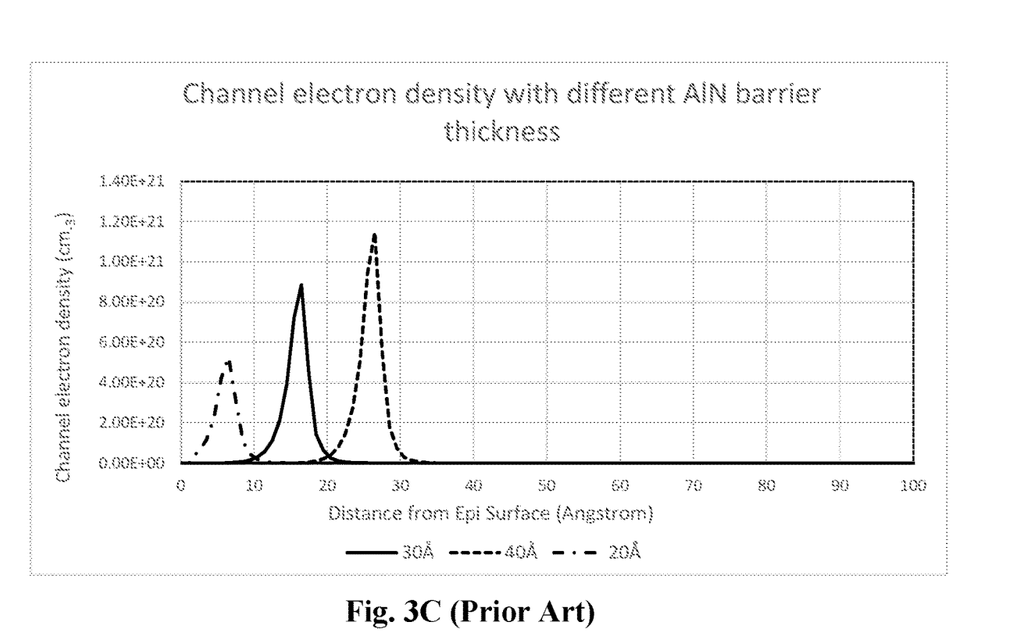
FIG. 3C shows a simulation of the channel electron density of the another embodiment with non-uniform AlN spacer thickness, showing that the region with thicker AlN spacer leads to more polarized charge.

The same problems apply to another group of HEMT epi and corresponding devices, where the AlN serves not as the spacer, but as the whole barrier. FIG. 3A shows a representative structure, with a target barrier layer thickness of 30 Å and a fluctuation of thickness from 20 Å to 40 Å. Similarly, the conduction band energy and channel electron density simulations are performed using Bandeng with Schrodinger correction and are shown in FIG. 3B and FIG. 3C respectively. FIG. 3B shows the variation of conduction band energy (eV) with respect to distance from Epi surface (Angstrom) for AlN barrier thickness of 20 Å, 40 Å and 30 Å respectively. FIG. 3C shows the variation of channel electron density (per $cm^3$) with respect to distance from Epi surface (Angstrom) for AlN barrier thickness of 20 Å, 40 Å and 30 Å respectively. It can be seen that a non-uniform AlN barrier thinness leads to non-uniformity in both conduction band energy and channel electron density with even larger contrast. This coupled with the fact that higher strain caused by a thicker AlN barrier at the same time, cause reliability issues, which prevent the current art AlN barrier HEMT epi and devices from any real applications.

The key to address the above device reliability issue is to improve the thickness uniformity and material quality for the AlN or high-Al-content layers. Conventionally, AlN layer using MOCVD is grown by flowing continuous TMAl (trimethylaluminum) and NH3 (ammonia) gas sources into MOCVD chamber with a typical growth temperature at <1150° C. (wafer surface temperature). Due to the relatively low growth temperature as well as high chemical reactivity of Al and N sources (typically TMAl vapor as Al source, $NH_3$ gas as N source in MOCVD), this method of AlN growth causes not only poor AlN crystalline quality, but also other issues such as AlN thickness non-uniformity. The poor AlN crystalline quality and thickness non-uniformity could cause all the above-mentioned HEMT reliability issues.

While it is critically important to improve the AlN quality and uniformity for better HEMT device reliability, it is arguably not easy to obtain the uniform and high-quality AlN epitaxial layers. The challenges of AlN growth arises from two fundamental issues involving the MOCVD growth of AlN material: 1) low surface Al atom mobility on wafer surface, which causes thickness non-uniformity as well as low AlN crystalline quality, 2) high chemical reactivity between TMAl and NH3, which also causes thickness non-uniformity, especially on wafer edges due to TMAl source starvation.

SUMMARY

In an embodiment, a method of fabricating a high-crystalline-quality and high-uniformity AlN layer within a high electron mobility transistor (HEMT) device with a metalorganic chemical vapor deposition (MOCVD) technique, includes: raising a temperature of a substrate to an ultra-high growth temperature; and supplying an Al source and an N source in pulses over the substrate under the ultra-high growth temperature, wherein the ultra-high growth temperature is at least 1300° C. At least for a first predetermined period of time in each cycle of the pulses, the Al source is switched on when the N source is switched off.

Preferably, the Al source is a trimethylaluminum (TMAl) gas source and the N source is an ammonia ($NH_3$) gas source.

Preferably, in the step of supplying the Al source and the N source Al source, a supply of the N source is off when a supply of the Al source is on, and the supply of the Al source is off when the supply of N source is on.

Preferably, the first predetermined period of time is in a range of 1s to 100s.

Preferably, at least for a second predetermined period of time in each cycle of the pulses, the Al source and the N source are both on.

Preferably, the first predetermined period of time is equal to the second predetermined period of time.

Preferably, a flow rate of the Al source in a state is in a range of 5 standard cubic centimeters per minute (sccm) to 100 standard litres per minute (slm) and a flow rate of the N source in an state is in a range of 5 standard cubic centimeters per minute (sccm) to 100 standard litres per minute (slm).

Preferably, the high-crystalline-quality and high-uniformity AlN layer is a spacer layer and is fabricated over the GaN channel layer of the HEMT device.

Preferably, the high-crystalline-quality and high-uniformity AlN layer is a barrier layer and is fabricated over the AlGaN channel layer of the HEMT device.

Preferably, a thickness of the high-crystalline-quality and high-uniformity AlN spacer layer ranges from 1 nm to 3 nm.

Preferably, a thickness of the high-crystalline-quality and high-uniformity AlN barrier layer ranges from 2 nm to 10 nm.

In another embodiment, a method of fabricating a high electron mobility transistor HEMT device, includes: growing a nucleation layer over a substrate; growing a buffer layer over the nucleation layer; growing a channel layer over the buffer layer, wherein the channel layer is a GaN layer and a temperature is maintained at less than 1150° C. in the step of growing the channel layer; after the step of the growing the channel layer, raising the temperature to an ultra-high growth temperature, wherein the ultra-high growth temperature is at least 1300° C.; and growing a spacer layer of AlN over the channel layer. The step of growing the spacer layer includes supplying a trimethylaluminum (TMAl) gas source and an ammonia ($NH_3$) gas source in pulses over the channel layer under the ultra-high growth temperature; at least for a first predetermined period of time in each cycle of the pulses, the TMAl gas source is switched on when the $NH_3$ source is switched off.

In another embodiment, a method of fabricating a high electron mobility transistor HEMT device, includes: growing a nucleation layer over a substrate; growing a buffer layer over the nucleation layer; growing a channel layer over the buffer layer, wherein the channel layer is a AlGaN layer and a temperature is maintained at less than 1150° C. in the step of growing the channel layer; after the step of the growing the channel layer, raising the temperature to an ultra-high growth temperature, the ultra-high growth temperature is at least 1300° C.; and growing a barrier layer of AlN over the channel layer. The step of growing the barrier layer includes supplying a trimethylaluminum (TMAl) gas source and an ammonia ($NH_3$) gas source in pulses over the channel layer under the ultra-high growth temperature; at least for a first predetermined period of time in each cycle of the pulses, the TMAl gas source is switched on when the $NH_3$ source is switched off.

BRIEF DESCRIPTION OF THE DRAWINGS

For a better understanding of the embodiments, reference will now be made by way of example only to the accompanying figures in which.

DETAILED DESCRIPTION OF THE EMBODIMENTS

Embodiments of the present invention will be readily understood by the following detailed description in conjunction with the accompanying drawings. To facilitate this description, like reference numerals designate like structural elements. Embodiments of the invention are illustrated by way of examples and not by way of limitation in the figures of the accompanying drawings.

The present disclosure relates to the fabrication of group III-nitride electronic epi materials in metalorganic chemical vapor deposition (MOCVD) system. Specifically, it discloses a method to fabricate high-crystalline-quality and high-uniformity AlN or high-Al-composition layers within high electron mobility transistor (HEMT) devices with MOCVD growth technique. The improvement of crystalline quality and uniformity of the layers are the key to realization of highly-reliable HEMT devices. The disclosed method involves utilization of ultra-high growth temperature (>=1300° C. wafer surface temperature) and repetitively alternating Al and N source supply to wafer surface (i.e. modulation of sources flows) to achieve high-uniformity and high-quality AlN or high-Al-composition layers. The ultra-high growth temperature process is to significantly improve the crystalline quality of the high-Al-composition or pure AlN layers, thus improve the device performance fabricated using the abovementioned epi material. The modulation of Al and N source flows greatly reduces the gas-phase chemical reaction between the two sources during gas-phase transport before reaching wafer surface, thereby reducing the Al source starvation on wafer surface, especially on the wafer edges, improving AlN growth uniformity. The growth method could be used to significantly improve high-Al-composition layer or pure AlN layer quality within high-quality III-nitride-based HEMT devices, thereby significantly improving DC and RF performance as well as device reliability. This is highly desirable for making high frequency materials and devices in the applications such as higher frequency wireless communications.

In one of the embodiments, the wafer is exposed to Al and N sources in pulses such that there is a period of time when Al source is supplied to wafer surface in absence of N source and vice-versa.

Figure 4:
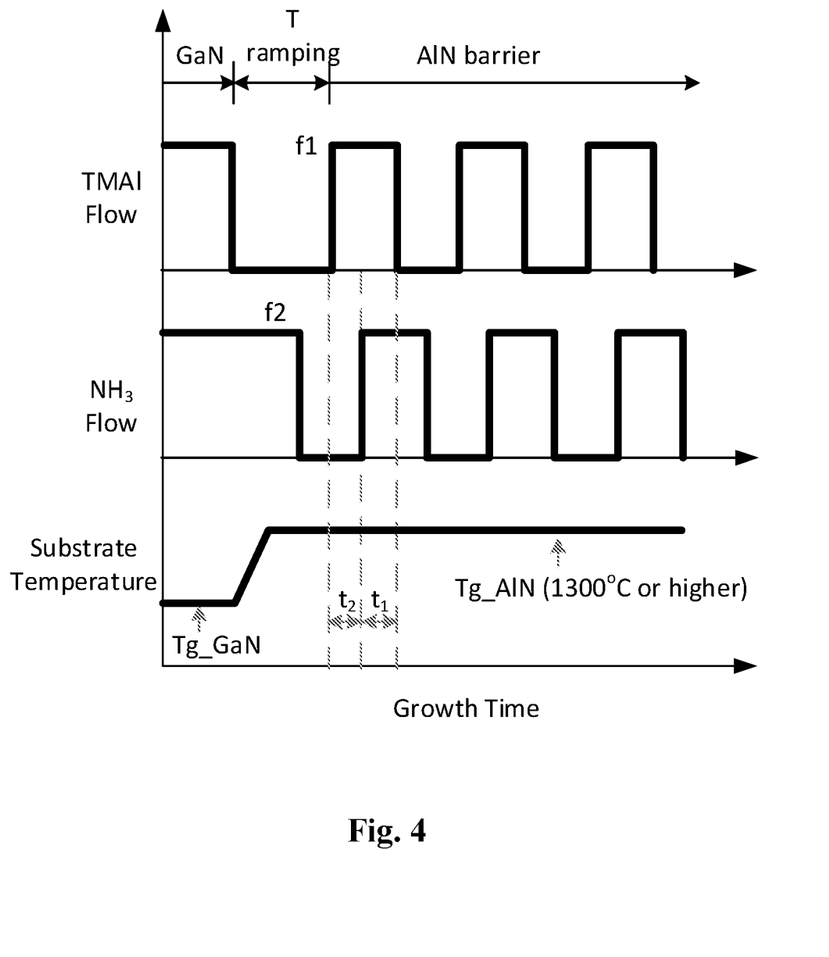
FIG. 4 shows a schematic of an embodiment for growth of AlN spacer after GaN channel layer within AlGaN/GaN HEMT device.

Referring to FIG. 1 and FIG. 4, a method of fabricating an AlN spacer layer 5 within the AlGaN/GaN HEMT device is disclosed. TMAl is used as an Al source and $NH_3$ is used as an N source. FIG. 4 shows a GaN layer formation region when N source is on and Al source is off. After the GaN layer formation, the temperature is raised from GaN growth temperature Tg_GaN (typically <1150° C.) to the AlN growth temperature Tg_AlN (≥1300° C.) during temperature (T) ramping period. The N source is supplied during the T ramping period to protect GaN layer from decomposition. As shown in the FIG. 4, TMAl and $NH_3$ gas sources are not supplied continuously, but rather in pulse mode. The TMAl supply without the presence of $NH_3$ gas could greatly reduce the gas-phase reaction between TMAl and $NH_3$ gases before reaching wafer surface, thereby reducing the Al source starvation on wafer surface, especially on the wafer edges, thereby improving AlN growth uniformity. The high growth temperature for AlN (≥1300° C.) is beneficial to enhance the Al atom mobility on wafer surface, and therefore improve the AlN thickness uniformity on a micro-scale. The high growth temperature can also help improve the AlN crystalline quality by giving Al and N atoms sufficient energy and mobilizing them to move to lower-energy points on wafer surface before incorporation into the AlN film.

After the growth temperature is stabilized at AlN growth temperature Tg_AlN, the $NH_3$ flow is suspended: the $NH_3$ flow rate is reduced from level f2 to zero. After a predetermined time duration, the TMAl flow is increased from zero to f1 with no $NH_3$ supply. Then, after a time duration of t2, the $NH_3$ flow is resumed and the $NH_3$ flow rate is increased from zero to f2. At this moment, there is a simultaneous supply of both sources. Then, after a time duration of t1, the TMAl flow is reduced from f1 to zero to complete the cycle. Afterwards, the cycle is repeated by providing the Al and N sources in pulses.

The f1 and f2 values are in the range of 5 standard cubic centimeters per minute (sccm) to 100 standard litres per minute (slm). The ratio f2/f1 (V/III ratio) affects the material quality and impurity concentration of the AlN layer. Among a period TMAl supply pulse (t1+t2), t1 represents a time period of simultaneously supplying both $NH_3$ and TMAl, while t2 represents a time period of supplying TMAl without $NH_3$. The TMAl pulse flow rate f1 will affect the AlN growth rate. Higher values for f1 will lead to higher growth rate for the AlN film. The t1 and t2 are both in the range of is to 100s. In one of the embodiments, both TMAl and $NH_3$ supply pulses have same duration, and each source has same on- and off-durations. In other embodiments, the durations for the TMAl and $NH_3$ supply pulses could be different, and each source could have different duration of on- and off-periods. Typically, 1300° C. as wafer surface temperature is above the hardware limits of most MOCVD reactors, but could still be reached by certain commercial MOCVD models without serious impact on the heater lifetime.

The ratio t1/(t1+t2) is between 0 and 1 (including 0 and excluding 1). When the ratio is 1, this is the case when the TMAl and $NH_3$ sources are being supplied simultaneously, so the ration should always be less than 1. When the ratio is 0, this is the case when the TMAl and $NH_3$ sources are supplied in a complete alternating sequence (a TMAl pulse followed by a $NH_3$ pulse then a TMAl pulse again) without any period of simultaneous supply of both sources. When the ratio is between 0 and 1, there is some time period of simultaneous supply of TMAl and $NH_3$ as well as some time period of supplying TMAl without $NH_3$.

Figure 5:
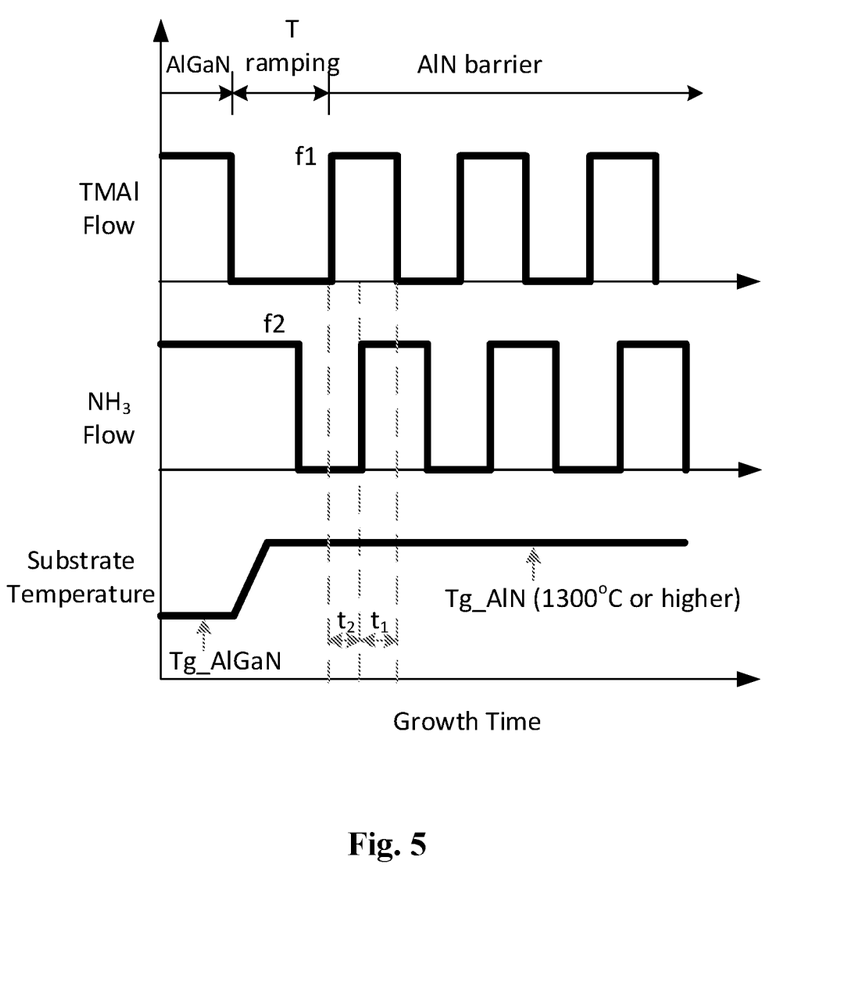
FIG. 5 shows a schematic of an embodiment for growth of AlN barrier after GaN channel layer within AlN/GaN HEMT device.

In another embodiment, the same concept can be applied to the growth of AlN barrier layer 6 within AlN/AlGaN HEMT device, where AlGaN layer servers as a channel layer 4 and the AlN layer serves as barrier layer 6. Two major differences from the embodiment of FIG. 4 are: 1) the AlN barrier layer 6 (2 nm-10 nm) is typically thicker than AlN spacer layer 5 (1 nm-3 nm), and 2) the channel layer 4 is AlGaN instead of GaN material. Using AlGaN as a channel material has the benefit of higher breakdown voltage for HEMT devices as well as lower lattice mismatch between the channel layer 4 and the AlN barrier layer 6 as compared to the case of using GaN channel in conjunction with AlN barrier. The growth schematic for the AlN barrier growth in the current embodiment is shown in FIG. 5. FIG. 5 shows an AlGaN layer formation region when N source and Al source are both on. After the AlGaN layer formation, the temperature is raised from AlGaN growth temperature Tg_AlGaN (typically ≥1150° C.) to the AlN growth temperature Tg_AlN (≥1300° C.) in temperature (T) ramping region. The Al source is switched off while the N source is switched on during the T ramping period to protect channel layer from decomposition. Further, referring to FIG. 5, the AlN barrier layer 6 can be fabricated in a similar way as the AlN spacer layer 5 explained in previous embodiment by providing Al and N sources in pulses and having at least a time period t2 in each cycle, when Al source and N source are not on together. As compared to the embodiment of FIG. 4, the number of source pulses required for the growth of AlN barrier layer may be more for larger thickness. In the case of using AlN as barrier, no AlN spacer layer is needed for the HEMT device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method of fabricating a high-crystalline-quality and high-uniformity AlN layer within a high electron mobility transistor (HEMT) device, the method comprising:
    raising a temperature of a substrate to an ultra-high growth temperature;
    supplying an Al source and an N source in pulses over the substrate under the ultra-high growth temperature, wherein the ultra-high growth temperature is at least 1300° C.;
    wherein, at least for a first predetermined period of time in each cycle of the pulses, the Al source is switched on when the N source is switched off.

2. The method of claim 1, wherein, the Al source is a trimethylaluminum (TMAl) gas source and the N source is an ammonia ($NH_3$) gas source.

3. The method of claim 1, wherein, in the step of supplying the Al source and the N source, a supply of the N source is off when a supply of the Al source is on, and the supply of the Al source is off when the supply of N source is on.

4. The method of claim 1, wherein the first predetermined period of time is in a range of 1s to 100s.

5. The method of claim 1, wherein at least for a second predetermined period of time in each cycle of the pulses, the Al source and the N source are both on.

6. The method of claim 5, wherein the first predetermined period of time is equal to the second predetermined period of time.

7. The method of claim 1, wherein a flow rate of the Al source is in a range of 5 standard cubic centimeters per minute (sccm) to 100 standard litres per minute (slm) and a flow rate of the N source is in a range of 5 standard cubic centimeters per minute (sccm) to 100 standard litres per minute (slm).

8. The method of claim 1, wherein the high-crystalline-quality and high-uniformity AlN layer is a spacer layer and is fabricated over a GaN channel layer over the HEMT device.

9. The method of claim 8, wherein a thickness of the high-crystalline-quality and high-uniformity AlN layer ranges from 1 nm to 3 nm.

10. The method of claim 1, wherein the high-crystalline-quality and high-uniformity AlN layer is a barrier layer and is fabricated over an AlGaN channel layer over the HEMT device.

11. The method of claim 10, wherein a thickness of the high-crystalline-quality and high-uniformity AlN layer ranges from 2 nm to 10 nm.

12. A method of fabricating a high electron mobility transistor HEMT device, the method comprising:
    growing a nucleation layer over a substrate;
    growing a buffer layer over the nucleation layer;
    growing a channel layer over the buffer layer, wherein the channel layer is a GaN layer and a temperature is maintained at less than 1150° C. in the step of growing the channel layer;
    after the step of the growing the channel layer, raising the temperature to an ultra-high growth temperature, wherein the ultra-high growth temperature is at least 1300° C.;
    growing a spacer layer of AlN over the channel layer, wherein the step of growing the spacer layer includes supplying an Al gas source and a N source in pulses over the channel layer under the ultra-high growth temperature;
    wherein, at least for a first predetermined period of time in each cycle of the pulses, the Al source is switched on when the N source is switched off.

13. The method of claim 12, wherein a thickness of the spacer layer ranges from 1 nm to 3 nm.

14. The method of claim 12, wherein the substrate is formed of SiC, the nucleation layer is formed of AlN, and the buffer layer is formed of GaN.

15. A method of fabricating a high electron mobility transistor HEMT device, the method comprising:
    growing a nucleation layer over a substrate;
    growing a buffer layer over the nucleation layer;
    growing a channel layer over the buffer layer, wherein the channel layer is a AlGaN layer and a temperature is maintained at less than 1150° C. in the step of growing the channel layer;
    after the step of the growing the channel layer, raising the temperature to an ultra-high growth temperature, wherein the ultra-high growth temperature is at least 1300° C.;
    growing a barrier layer of AlN over the channel layer, wherein the step of growing the barrier layer includes supplying an Al source and a N gas source in pulses over the channel layer under the ultra-high growth temperature;
    wherein, at least for a first predetermined period of time in each cycle of the pulses, the Al source is switched on when the Al source is switched off.

16. The method of claim 15, wherein a thickness of the barrier layer ranges from 2 nm to 10 nm.

17. The method of claim 15, wherein the substrate is formed of SiC, the nucleation layer is formed of AlN, and the buffer layer is formed of GaN.

* * * * *